(12) United States Patent
 Jeong

(10) Patent No.: US 8,705,294 B2
(45) Date of Patent: Apr. 22, 2014

(54) NONVOLATILE MEMORY AND METHOD OF CONTROLLING THEREOF

(75) Inventor: Jaeyong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 85 days.

(21) Appl. No.: 13/552,668

(22) Filed: Jul. 19, 2012

(65) Prior Publication Data
US 2013/0021852 A1    Jan. 24, 2013

(30) Foreign Application Priority Data

Jul. 20, 2011  (KR) .......................... 10-2011-0071907

(51) Int. Cl.
*G11C 16/04*    (2006.01)
(52) U.S. Cl.
USPC ................... 365/189.05; 365/205; 365/233.5
(58) Field of Classification Search
CPC .. G11C 11/5628; G11C 11/5642; G11C 7/12; G11C 11/4091; G11C 7/065; G11C 11/4097; G11C 13/004; G11C 7/1051; G11C 7/106; G11C 7/1078
USPC .................... 365/189.05, 205, 233.5, 189.15
See application file for complete search history.

(56) References Cited

U.S. PATENT DOCUMENTS

| | | | |
|---|---|---|---|
| 6,549,457 B1 | 4/2003 | Srinivasan et al. | |
| 7,505,341 B2 * | 3/2009 | Kim et al. | 365/205 |
| 7,565,518 B2 | 7/2009 | Kuroda | |
| 7,688,640 B2 | 3/2010 | Kang | |

FOREIGN PATENT DOCUMENTS

| | | |
|---|---|---|
| JP | 2004-246958 A | 9/2004 |
| JP | 2008-257850 A | 10/2008 |
| KR | 10-0634333 B1 | 10/2006 |
| KR | 100843242 B1 | 6/2008 |

* cited by examiner

*Primary Examiner* — David Lam
(74) *Attorney, Agent, or Firm* — Volentine & Whitt, PLLC

(57) ABSTRACT

A memory system includes a nonvolatile memory and a controller. The nonvolatile memory includes a memory cell array storing setup data and reference data, and first and second latch units respectively configured to store the setup data and the reference data sensed from the memory cell array upon a power-up of the memory system. The controller is configured to control a sensing operation of the nonvolatile memory. An operating environment of the nonvolatile memory is determined by the setup data stored in the first latch unit, and the controller controls the nonvolatile memory to re-store the setup data of the memory cell array in the first latch unit when the reference data of the second latch unit is changed.

20 Claims, 15 Drawing Sheets

NONVOLATILE MEMORY AND METHOD OF CONTROLLING THEREOF

CROSS-REFERENCE TO RELATED APPLICATIONS

A claim of priority under 35 USC §119 is made to Korean Patent Application No. 10-2011-0071907, filed on Jul. 20, 2011, the entirety of which is hereby incorporated by reference.

BACKGROUND OF THE INVENTION

The inventive concepts described herein generally relate to semiconductor memories and, more particularly, to a nonvolatile memory and a control method of the same.

Semiconductor memory devices are memory devices implemented using semiconductors such as silicon (Si), germanium (Ge), gallium arsenide (GaAs), and indium phosphide (InP). In general, the semiconductor memory devices are classified as either volatile memory devices or nonvolatile memory devices.

Volatile memory devices are characterized by the loss of stored data when power supply thereto is interrupted. Examples of volatile memory devices include static random-access memory (SRAM) devices, dynamic random-access memory (DRAM) devices, and synchronous dynamic random-access memory (SDRAM) devices. On the other hand, nonvolatile memory devices are characterized by the retention of stored data stored when power supply thereto is interrupted. Examples of nonvolatile memory devices include read-only memory (ROM) devices, programmable read-only memory (PROM) devices, electrically programmable read-only memory (EPROM) devices, electrically erasable and programmable read-only memory (EEPROM) devices, flash memory devices, phase-change random-access memory (PRAM) devices, magnetic random-access memory (MRAM) devices, resistive random-access memory (RRAM) devices, and ferroelectric random-access memory (FRAM) devices. Among these, flash memory devices are generally classified as either NOR-type flash memory devices or NAND-type flash memory devices depending on a connection scheme of memory cells within the devices.

A nonvolatile memory device stores setup information which is used to set an operation environment, for example upon power on of the nonvolatile memory device. For example, the setup information may include test result information of the nonvolatile memory device. Setup information may, for example, be stored in a by means of laser fuse and/or an electrical fuse (e-fuse) technologies. In laser fuse technology, a plurality of laser fuses is selectively cut to store setup information and the nonvolatile memory is controlled according to the stored setup information. In e-fuse technology, data corresponding to setup information is stored in memory cells of nonvolatile memory, the setup data stored in the memory cells are sensed during an operation of the nonvolatile memory, and the nonvolatile memory is controlled according to the sensed setup data.

SUMMARY OF THE INVENTION

Embodiments of the inventive concept provide a memory system, a memory device, and a control method of a nonvolatile memory including a plurality of memory cells.

According to an aspect of the inventive concept, the memory system includes a nonvolatile memory and a controller. The nonvolatile memory includes a memory cell array storing setup data and reference data, and first and second latch units respectively configured to store the setup data and the reference data sensed from the memory cell array upon a power-up of the memory system. The controller is configured to control a sensing operation of the nonvolatile memory. An operating environment of the nonvolatile memory is determined by the setup data stored in the first latch unit, and the controller controls the nonvolatile memory to re-store the setup data of the memory cell array in the first latch unit when the reference data of the second latch unit is changed.

According to another aspect of the inventive concept, the memory device includes a nonvolatile memory array configured to store setup data and reference data, a read circuit connected to the nonvolatile memory array, a latch circuit connected to the read circuit, a control logic configured to load the setup data and the reference data into the latch circuit via the read circuit upon a power-up of the memory device, a data detector configured to detect a corruption of the reference data loaded into the latch circuit. The control logic is further configured to re-load the setup data and the reference data into the latch circuit when the data detector detects the corruption of the reference data.

According to another aspect of the inventive concept, the control method of a nonvolatile memory including a plurality of memory cells includes controlling the nonvolatile memory to sense reference data and setup data stored in the memory cells at a power-up of the nonvolatile memory, determining whether the sensed reference data is changed when a voltage level of a power becomes lower than a critical voltage level, and controlling the nonvolatile memory to re-sense the setup data according to a result of the determination. An operating environment of the nonvolatile memory is determined according to the sensed setup data.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION

The inventive concept will now be described more fully hereinafter with reference to the accompanying drawings, in which preferred embodiments of the inventive concept are shown. However, the inventive concept may be embodied in many different forms and should not be construed as limited to the embodiments set forth herein. Rather, these embodiments are provided so that this disclosure will be thorough and complete, and will fully convey the scope of the inventive concept to those skilled in the art.

The terms used in the present specification are used to describe a particular embodiment and are not used to limit the present invention. As in the present specification, a singular form may include a plural form unless the singular form definitely indicated otherwise in the context. Also, in the present specification, the terms "comprise" and/or "comprising" specify existence of shapes, numbers, steps, operations, members, elements, and/or groups thereof, which are referred to, and do not exclude existence or addition of one or more different shapes, numbers, operations, members, elements, and/or groups thereof.

Figure 1:
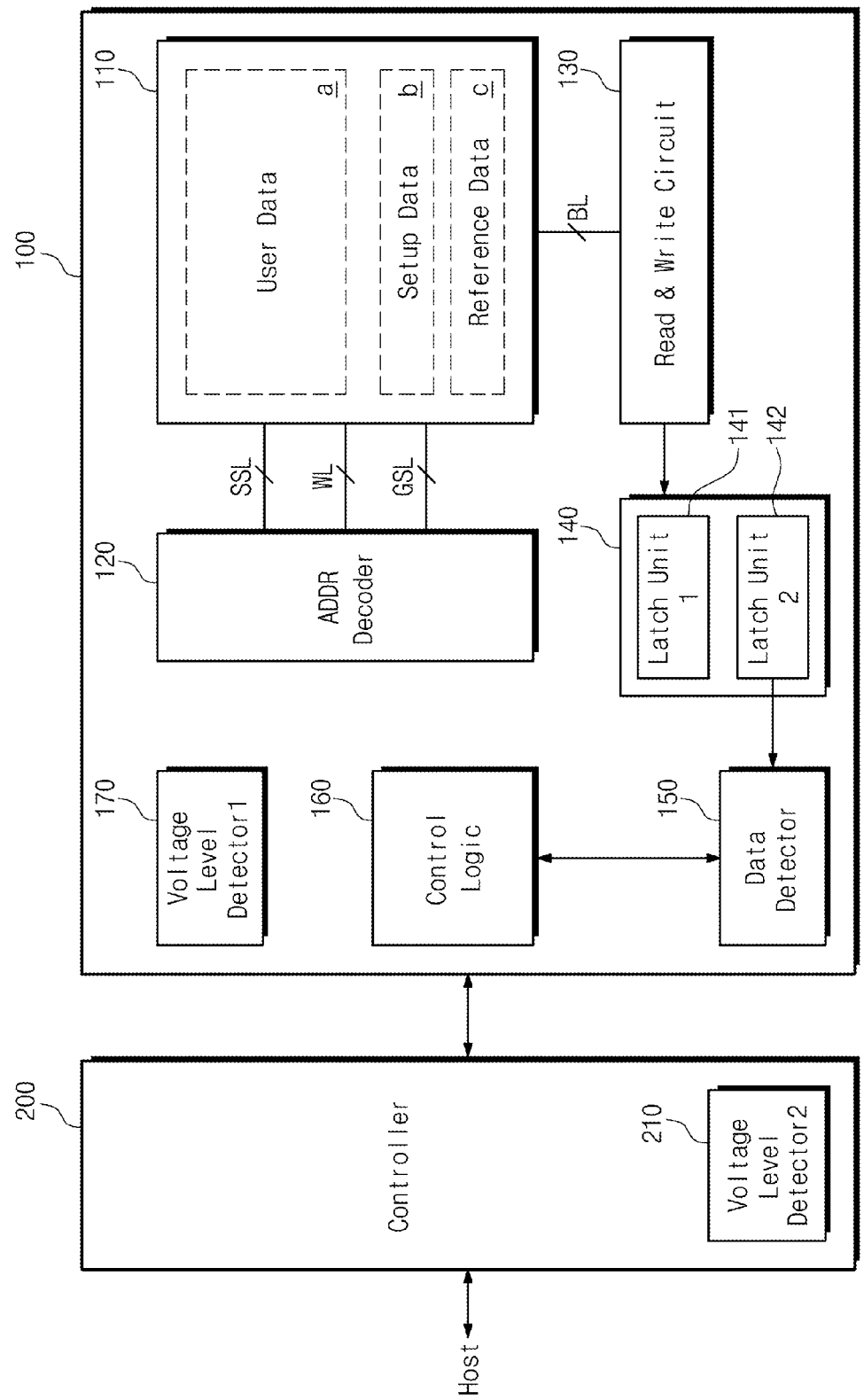
FIG. 1 is a block diagram of a memory system according to an embodiment of the inventive concept.
Figure 2:
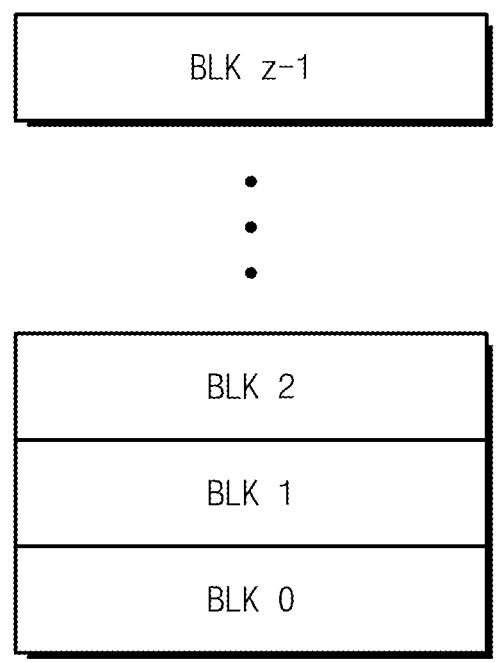
FIG. 2 is a block diagram of a memory cell array shown in FIG. 1.
Figure 3:
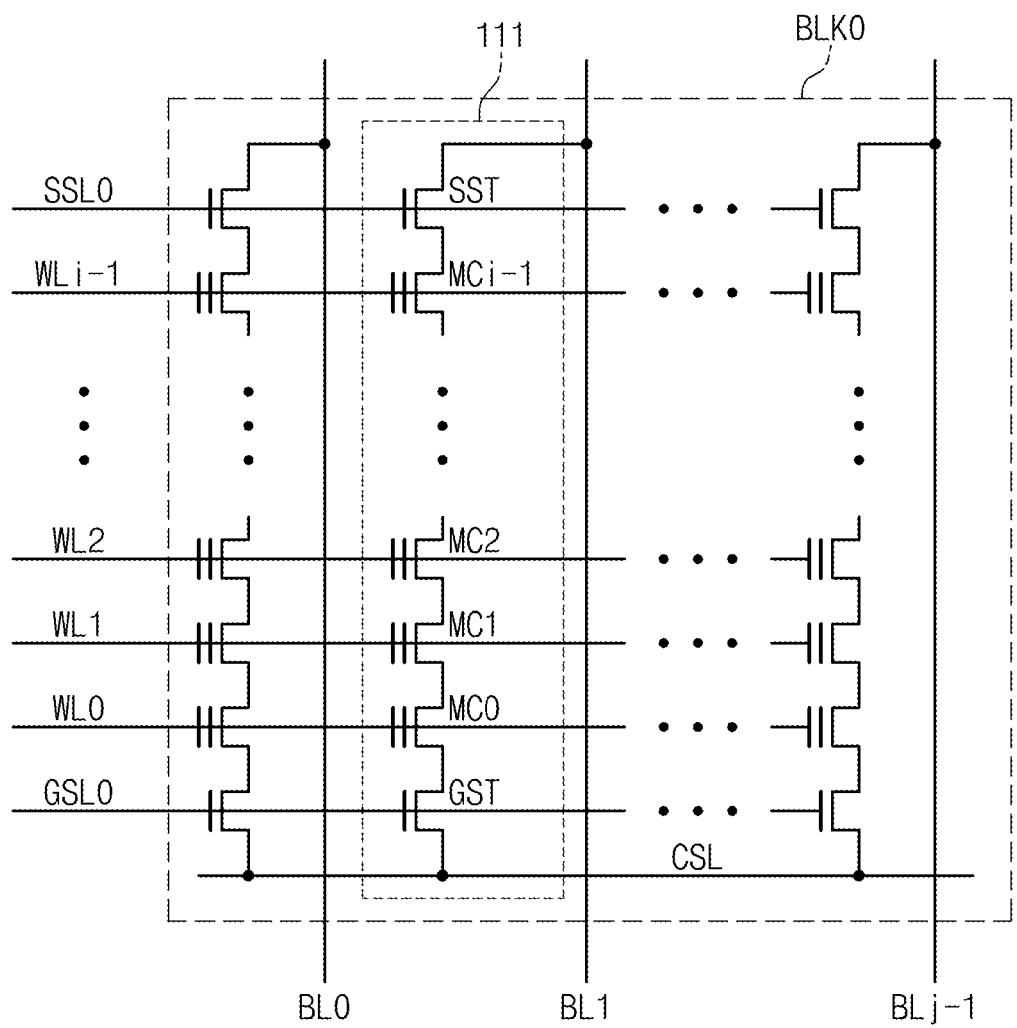
FIG. 3 is a block diagram of a zeroth memory block shown in FIG. 2.

FIG. 1 is a block diagram of a memory system 1000 according to an embodiment of the inventive concept. FIG. 2 is a block diagram of a memory cell array 110 shown in FIG. 1. FIG. 3 is a block diagram of a zeroth memory block BLK0 shown in FIG. 2.

Referring to FIG. 1, the memory system 1000 includes a nonvolatile memory 100 and a controller 200.

The nonvolatile memory 100 includes a memory cell array 110, an address decoder (ADDR Decoder) 120, a read and write circuit (Read & Write Circuit) 130, a register 140, a data detector 150, a control logic 160, and a first voltage level detector 170.

The memory cell array 110 is connected to the address decoder 120 through wordlines WL, string selection lines SSL, and ground selection lines GSL. The memory cell array 110 is connected to the read and write circuit 130 through bitlines BL. The memory cell array 110 includes a plurality of memory cells. In the example of this embodiment, the memory cells are arranged in an array of rows and columns, where memory cells arranged in a same row are connected to a same wordline WL among a plurality of wordlines WL, and memory cells arranged in a same column direction are connected to as same bit line among a plurality of bitlines BL.

In addition, referring to FIG. 2, the memory cell array 110 includes a plurality of memory cell blocks BLK0-BLKz−1, each including a plurality of memory cells. FIG. 3 shows an example of one of the memory blocks, namely, a zeroth memory block BLK0. Memory cells of respective rows are connected to zeroth to (i−1)th wordlines WL0-WLi−1. Memory cells of respective columns are connected to zeroth to (j−1)th bitlines BL0-BLj−1.

The zeroth data block BLK0 further includes string selection transistors connected to a zeroth string selection line SSL0 and ground selection transistors connected to a zeroth ground selection line GSL0. One string selection transistor SST, one ground selection transistor GST, and a plurality of memory cells MC0-MCi−1 may constitute one string of the memory cell array 110.

The zeroth memory block BLK0 may be selected by applying a voltage to each of the zeroth string and ground selection lines SSL0 and GSL0. In addition, the wordlines WL0-WLi−1 may be selected or unselected by applying a voltage to each of the wordlines WL0-WLi−1.

First to (z−1)th memory blocks BLK1-BLKz−1 shown in FIG. 2 may be configured the same as the zeroth memory block BLK0 described above with reference to FIG. 3.

Returning to FIG. 1, user data (a), setup data (b), and reference data (c) are stored in the memory cells of the memory cell array 110. The user data (a) may be data managed by a user of the memory system 100. For example, the user data (a) may be data received from a host and transferred to the nonvolatile memory device 100 through a controller 200 before being programmed to the memory cell array 110. The user data (a) may be data erased according to a request from the host or control of the controller 200.

The setup data (b) may be data for setting up an operation environment of the nonvolatile memory 100. For example, various voltage levels required for the operation of the nonvolatile memory 100 may be set up based on the setup data (b). For example, a column defect and a block defect of the nonvolatile memory 100 may be managed based on the setup data (b). The column defect and the block defect are detected in a test step after fabrication of the nonvolatile memory 100, and the setup data (b) may be determined according to a result of the detection. For example, an algorithm required for the operation of the nonvolatile memory 100 may be determined according to the setup data (b) (algorithm tuning). For example, the setup data (b) may include identification (ID) information of the nonvolatile memory 100.

When a power starts to be supplied to the memory system 1000, the nonvolatile memory 100 may sense the setup data and operate based on the sensed data. This sensing operation may be performed according to a request of the controller 200.

According to the embodiment of the inventive concept, reference data (c) is further stored in the memory cell array 110. The reference data (c) may have a predetermined data pattern. The reference data (c) may be also sensed when the setup data (b) is sensed.

The address decoder 120 is connected to the memory cell array 110 through wordlines WL. The address decoder 120 operates according to the control of the control logic 160.

The address decoder 120 may decode a block address among addresses received from the controller 120 and select memory blocks of the memory cell array 110 according to the decoded block address.

The address decoder 120 may decode a row address among the addresses received from the controller 200 and select wordlines WL according to the decoded row address.

The address decoder 120 may decode a column address among the addresses received from the controller 200 and provide the decoded column address to the read and write circuit 130.

The read and write circuit 130 is connected to the memory cell array 110 through bitlines BL. The read and write circuit 130 operates according to the control of the control logic.

During a program operation, the read and write circuit 130 may program data received from the controller 200 to memory cells of a selected wordline. During a read operation, the read and write circuit 130 may read data from memory cells connected to the selected wordline. The read and write circuit 130 may selectively transmit, to the controller 200, data corresponding to the decoded column address from the address decoder 120 among the read data. Exemplarily, the read and write circuit 130 may include a page buffer (or page register), a column selection circuit, and so forth.

The register 140 includes first and second latch units 141 and 142. Each of the first and second latch units 141 and 142 may include a plurality of latches. Each of the latches is a nonvolatile latch and may provide a high operating speed.

On power-up, the latches included in the first and second latches 141 and 142 are first initialized. For example, all latches included in the nonvolatile memory 100 may be initialized on power-up. The nonvolatile 100 itself may perform this initialization operation. When the first voltage level detector 170 senses that a power is supplied to the memory system 1000, this initialization operation may be performed according to the control of the control logic 160.

Then, the setup data (b) may be generated. The sensed setup data (b) may be stored in the first latch unit 141 through the read and write circuit 130. This sensing operation may be performed according to the request of the controller 200 and controlled by the control logic 160. The nonvolatile memory 100 may operate based on the sensed setup data (b). For example, a level of a voltage applied to a selected wordline and levels of voltages applied to unselected wordlines may be adjusted according to the sensed setup data (b). For example, if one program operation includes a plurality of program loops, levels of voltages applied to wordlines WL in each program loop may be adjusted according to the sensed setup data (b). For example, the control logic 160 may determine algorithms required for operations of the nonvolatile memory 100 (e.g., program, read, and erase operations) based on the sensed setup data (b). For example, the control logic 160 may determine a defective column and a defective memory block based on the sensed setup data (b), and replace the determined defective column and the determined defective memory block with a redundant column and a redundant memory block, respectively.

When the setup data (b) is sensed, the nonvolatile memory 100 becomes a ready state. The ready state means a state in which the nonvolatile memory 100 is capable of performing read, write, and erase operations according to the control of the controller 200.

The first latch unit 141 includes volatile latches. Accordingly, when a power supplied to the nonvolatile memory 100 is unstable (e.g., the power becomes lower than a critical voltage level), the setup data (b) stored in the first latch unit 141 may be lost. If the nonvolatile memory 100 operates based on the lost setup data (b), the operation reliability of the nonvolatile memory 100 may not be ensured.

The reference data (c) may be stored in the second latch unit 142. On power-up, the reference data (c) stored in the memory cell array 110 may be sensed. The sensed reference data (c) may be stored in the second latch unit 142 through the read and write circuit 130. That is, on power-up, not only the setup data (b) but also the reference data (c) may be sensed.

When the power supplied to the nonvolatile memory 100 is unstable, similar to the first latch unit 141, the reference data (c) stored in the second latch unit 142 may be changed. That is, it will be supposed that when the reference data (c) stored in the second latch unit 142 is changed, the setup data (b) stored in the first latch unit 142 is lost or corrupted.

Figure 4:
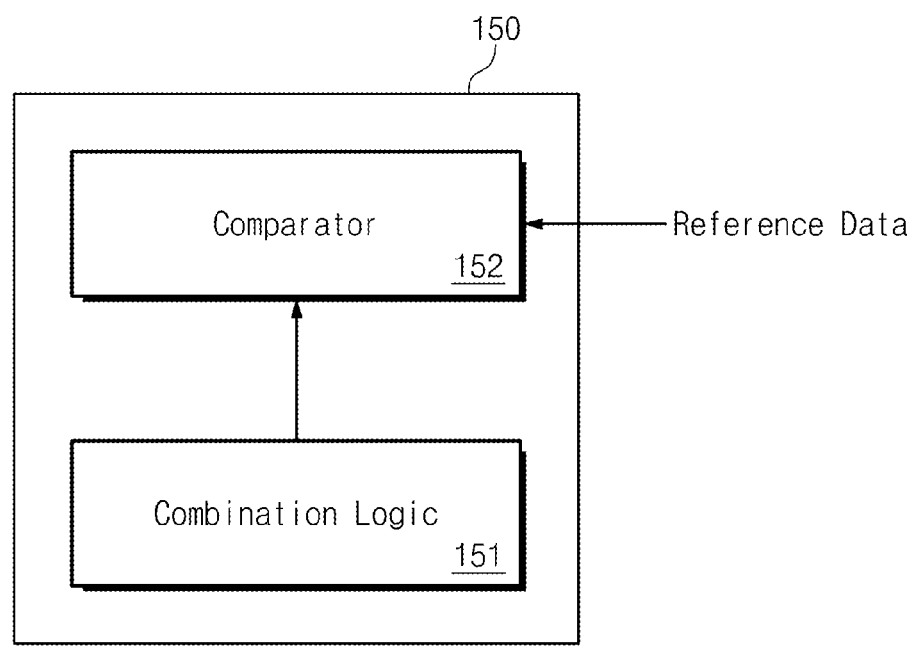
FIG. 4 is a block diagram of a data detector.

The data detector 150 may detect the change of the reference data (c) stored in the second latch unit 142. Referring to FIG. 4, exemplarily, the data detector 150 may include a combination logic 151 configured to generated the same output as a data pattern of the reference data (c) and a comparator 152 configured to compare the output of the combination logic 151 with the data stored in the second latch unit 142.

Exemplarily, the data detector 150 may monitor the reference data (c) stored in the second latch unit 142 and detect whether the reference data (c) is changed. Exemplarily, the data detector 150 may execute inquires as to whether the reference data (c) stored in the second latch unit 142 is changed, and output a result of the inquiry to the control logic 160.

Returning to FIG. 1, the control logic 160 controls the overall operation of the nonvolatile memory 100. The control logic 160 may control the nonvolatile memory 100 based on the setup data (b) stored in the first latch unit 141.

According to the output of the first voltage level detector 170, the control logic 160 may detect that a power is supplied to the memory system 1000. At this point, the first voltage level detector 170 may detect a level of a voltage supplied to the memory system 1000 and notify the control logic 160 that it is in a power-up state.

On power-up, the control logic 160 may first initialize latches included in the nonvolatile memory 100. According to the request from the controller 200, the control logic 160 may load the setup data (b) and the reference data (c) to the first and second latch units 141 and 142, respectively.

When a latch status read signal (see LSR in FIG. 10) is received from the controller 200, the control logic 160 may inquire a detection result of the data detector 150 and transmit information on the detection result to the controller 200. The controller 200 may control the nonvolatile memory 100 to re-sense the setup data (b) and the reference data (c) according to the information on the detection result. When it is determined that the reference data (c) is not changed, the sensing operation may not be further performed. On the other hand, when it is determined that the reference data (c) is changed, the controller 200 may control the nonvolatile memory 100 to re-sense the setup data (b) and the reference data (c). According to the control of the controller 200, the control logic 160 may reload the setup data (b) and the reference data (c) to the first and second latch units 141 and 142, respectively.

The controller 200 is connected to a host and the nonvolatile memory 100. The controller 200 is configured to access the nonvolatile memory 100 in response to requests from the host. For example, the controller 200 is configured to control read, write, erase, and background operations. The background operation may include an operation in which the nonvolatile memory 100 is set to a ready state (a state capable of performing the read, write, and erase operations) by sensing the setup data (b).

The controller 200 is configured to provide an interface between the nonvolatile memory 100 and the host. The controller 200 is configured to drive firmware for controlling the nonvolatile memory 100.

The controller 200 includes a second voltage level detector 210. The second voltage level detector 210 may detect a voltage supplied to the memory system 1000. For example, the controller 200 and the memory 100 may operate with the same power. Alternatively, the second voltage level detector 210 may sense a voltage supplied to the nonvolatile memory 100. For example, when the controller 200 supplies a power to the nonvolatile memory 100, the second voltage level detector 210 may detect the power supplied to the nonvolatile memory 100 from the controller 200.

After the power-up, the controller 200 may control the nonvolatile memory 100 to sense the setup data (b) and the reference data (c). The sensing operation may be performed after an initialization operation is performed in the nonvolatile memory 100. For example, the controller 200 may transmit a control signal for the sensing operation to the nonvolatile memory 100 after the lapse of a predetermined time from the point of the power-up such that the initialization operation is performed after the initialization operation is performed.

When a level of a voltage supplied to the memory system 1000 becomes lower than a predetermined voltage level, the second voltage level detector 210 may generate an interrupt signal. In response to the interrupt signal from the second voltage level detector 210, the controller 200 may inquire of the nonvolatile memory 100 whether the reference data stored in the second latch unit 142 is changed. Specifically, the controller 200 may transmit the latch status read signal to the nonvolatile memory 100. The control logic 160 may transmit the detection result of the data detector 150 to the controller 200 in response to the received latch status read signal.

The controller 200 may control the nonvolatile memory 200 to re-sense the setup data (b) and the reference data (c) according to the detection result received from the nonvolatile memory 100.

According to an embodiment of the inventive concept, sensed setup data is re-sensed depending on whether the reference data (c) is changed. Therefore, reliability of the setup data (b) stored in the latch unit 141 may be ensured even though a power is unstable. As a result, reliability of the nonvolatile memory 100 and reliability of the memory system 1000 including the nonvolatile memory 100 may be enhanced.

Figure 5:
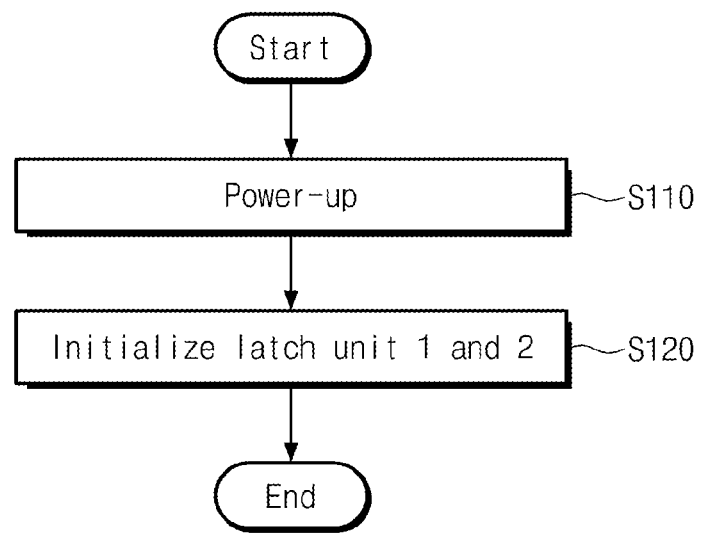
FIG. 5 is a flowchart illustrating an operation of a nonvolatile memory on power-up.

FIG. 5 is a flowchart illustrating an operation of the nonvolatile memory 100 on power-up. Referring to FIGS. 1 and 5, at S110, a power starts to be supplied to the memory system 100. This is detected by the first voltage level detector 170. At S120, the control logic 160 initializes the first and second latch units 141 and 142.

Figure 6:
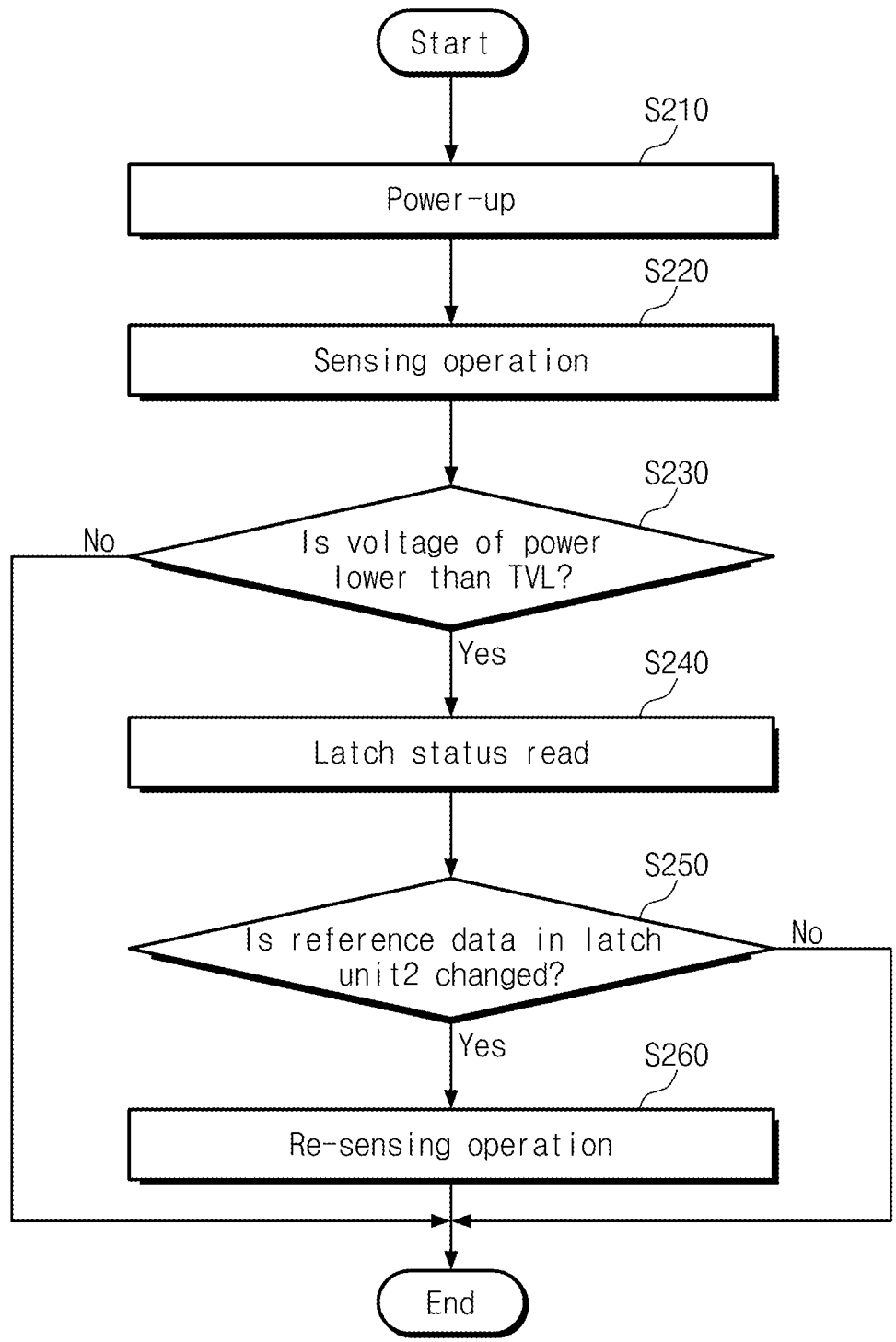
FIG. 6 is a flowchart illustrating an embodiment of a control method of a nonvolatile memory.

FIG. 6 is a flowchart illustrating an embodiment of a method of controlling the nonvolatile memory 100 by the controller 200. Referring to FIGS. 1 and 6, at S210, a power is supplied to the memory system 1000. At S220, a sensing operation is performed. The controller 200 controls the nonvolatile memory 100 to generate a control signal such that the sensing operation is performed.

At S230, it is determined whether a voltage level of the power is lower than a critical voltage level. The fact that a voltage level of the power is lower than a critical voltage level means that a status data (b) stored in the first latch unit 142 may be lost. When the voltage level of the power is lower than the critical voltage level, the process flow proceeds to S240.

At S240, latch status reading is performed. The controller 200 transmits a latch status read signal to the nonvolatile memory 100 and receives, from the nonvolatile memory device 100, information on whether the reference data (c) stored in the second latch unit 142 is changed.

At S250, it is checked whether the reference data (c) stored in the second latch unit 142 is changed. Based on the information received from the nonvolatile memory 100, the controller 200 checks whether the reference data (c) stored in the second latch unit 142 is changed. If the reference data (c) stored in the second latch unit 142 is changed, the process flow proceeds to S260.

At S260, a sensing operation is re-performed. The controller 200 controls the nonvolatile memory 100 to generate a control signal such that the sensing operation is performed. For example, the controller 200 transmits a reset signal to the nonvolatile memory 100. The nonvolatile memory 100 reloads the status data (b) and the reference data (c) to the first and second latch units 141 and 142 in response to the reset signal, respectively. As a result, reliability of the status data (b) stored in the first latch unit 141 may be improved.

Figure 7:
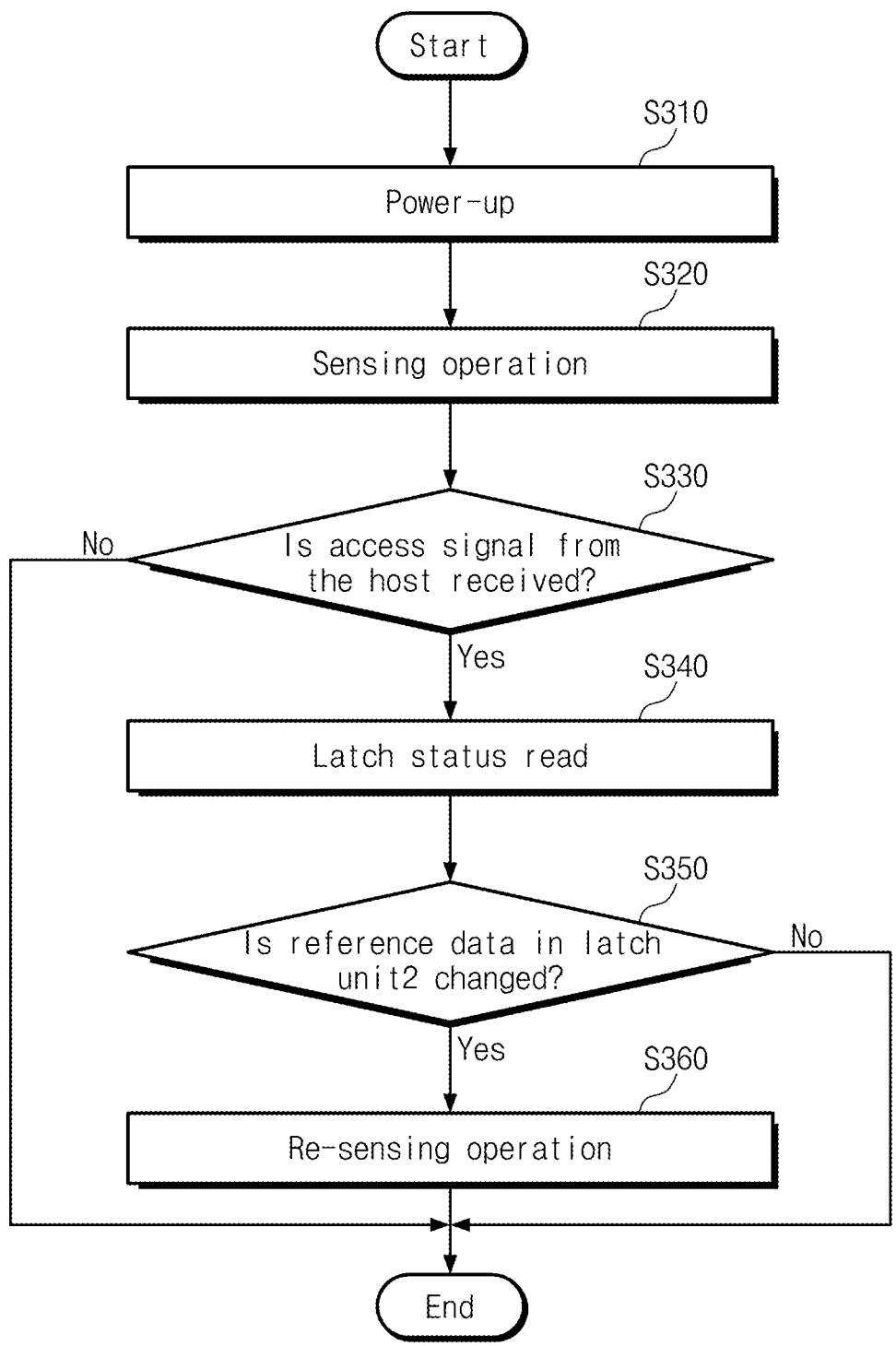
FIG. 7 is a flowchart illustrating another embodiment of a control method of a nonvolatile memory.

FIG. 7 is a flowchart illustrating another embodiment of a method of controlling the nonvolatile memory 100 by the controller 200. In FIG. 7, S330 is substituted for S230 in FIG. 6 in which it is determined whether a voltage level of a power is lower than a critical voltage level. Hereinafter, duplicate explanations of FIG. 6 as applied to FIG. 7 will be omitted.

Referring to FIGS. 1 and 7, at S330, the controller 200 receives an access signal from a host. The access signal may be a signal requesting a program operation, a read operation or an erase operation of the nonvolatile memory 100. At S340, the controller 200 performs latch status reading when receiving the access signal. At S350, the controller 200 determines whether the reference data (c) stored in the second latch unit 142 is changed. At 360, the controller 200 controls the nonvolatile memory 100 to re-perform the sensing operation according to the result of the determination.

Figure 8:
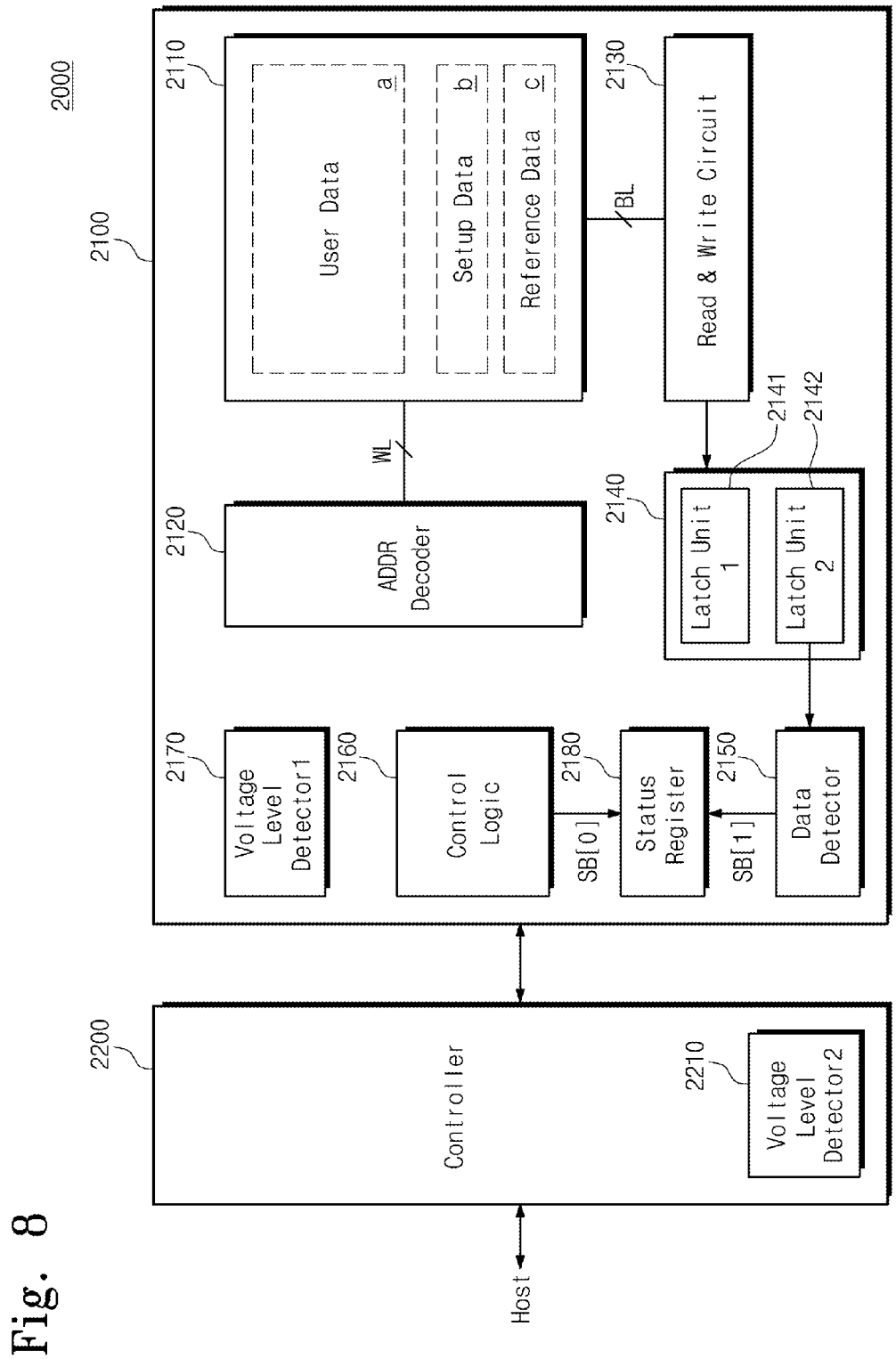
FIG. 8 is a block diagram of a memory system according to another embodiment of the inventive concept.

FIG. 8 is a block diagram of a memory system 2000 according to another embodiment of the inventive concept. As illustrated, the memory system 200 further includes a status register 2180. The status register 2180 stores a zeroth status bit SB[0] and a first status bit SB[1].

A control logic 2160 may adjust a value of the zeroth status bit SB[0] depending on whether a sensing operation is performed on setup data (b) and reference data (c). For example, when a power is supplied to the memory system 2000 and an initialization operation of a nonvolatile memory 2100 is performed, a logical value of the zeroth status bit SB[0] may be "0". When the setup data (b) and the reference data (c) are sensed, a control logic 2160 may changes the logical value of the zeroth status bit SB[0] to "1".

A data detector 2150 may adjust a value of the first status bit SB[1] depending on whether the reference data (c) stored in a second latch unit 2142 is changed. For example, when an output of a combination logic (151 in FIG. 4) is different from the reference data (c) stored in the second latch unit 2142, a comparator (152 in FIG. 4) may adjust the value of the first status bit SB[1] to "0". Meanwhile, when an output of a combination logic (151 in FIG. 4) is identical to the reference data (c) stored in the second latch unit 2142, a comparator (152 in FIG. 4) may adjust a value of the first status bit SB[1] to "1".

A controller 2200 may generate a latch status read signal when a power is down. Alternatively, the controller 2200 may generate a latch status read signal when the voltage level of the power supplied to the memory system 2000 is lower than the critical voltage level. In response to the latch status read signal, the control logic 2160 may provide the zeroth and first status bits SB[0] and SB[1] to the controller 2200.

According to the provided zeroth and first status bits SB[0] and SB[1], the controller 2200 may control an initialization operation of the nonvolatile memory 2100 and a sensing (or re-sensing) operation of the setup data (b) and the reference data (c).

Figure 9:
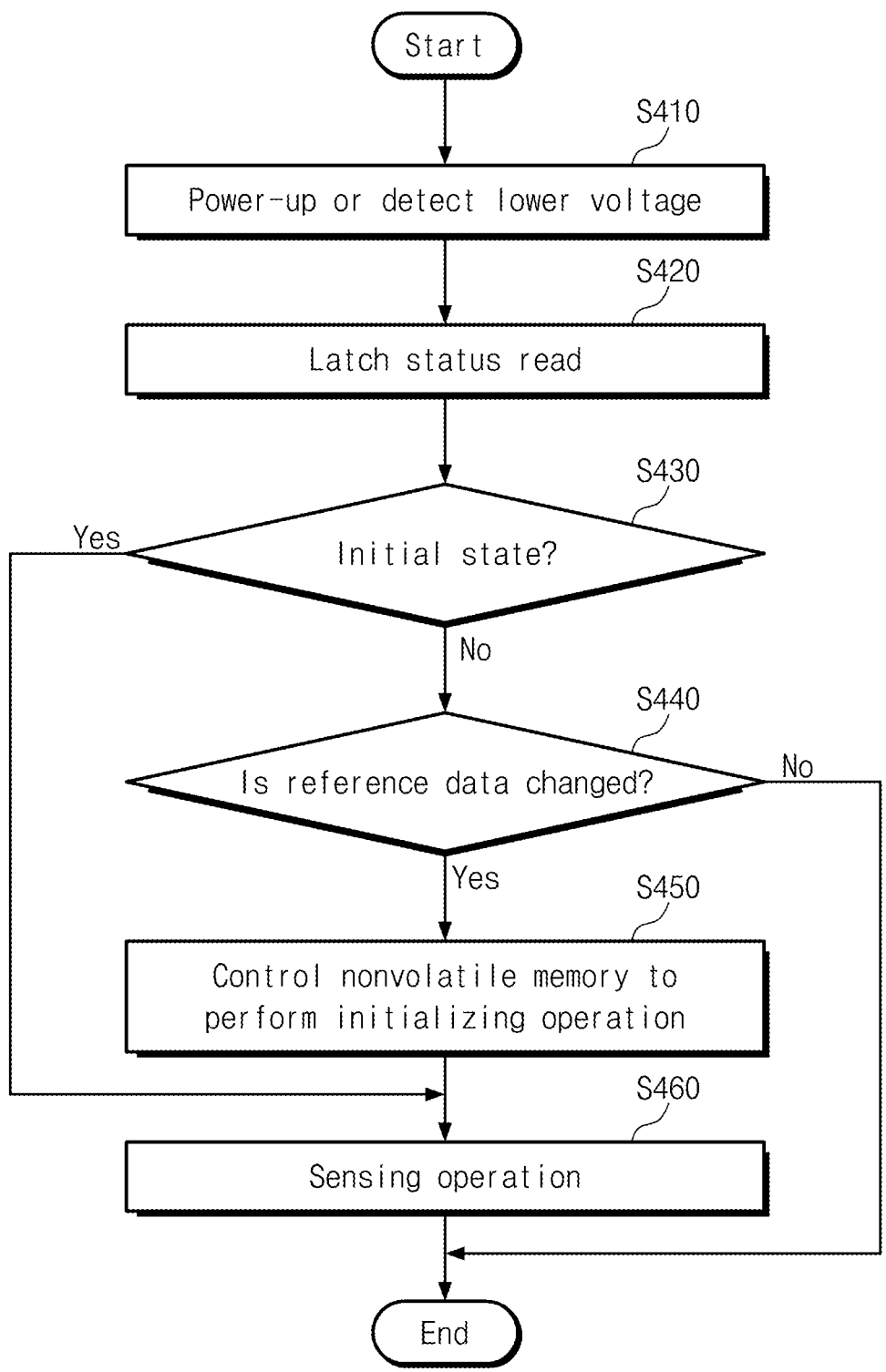
FIG. 9 is a flowchart illustrating further another embodiment of a control method of a nonvolatile memory device.

FIG. 9 is a flowchart illustrating another embodiment of a method of controlling the nonvolatile memory device 2100 by the controller 2200. Referring to FIGS. 8 and 9, at S410, the controller 220 detects power-up or detects that a voltage level of a power is lower than a critical voltage level. At S420, the controller 2200 performs latch status reading. According to the latch status reading, the controller 220 receives the zeroth and first status bits SB[0] and SB[1] from the nonvolatile memory 2100.

At S430, according to the zeroth status bit SB[0], the controller 2200 determines whether first and second latch units 2141 and 2142 are in an initialized state. For example, the fact that a logical value of the zeroth status bit SB[0] is "0" means that the first and second latch units 2141 and 2142 are in the initialized state. For example, the fact that a logical value of the zeroth status bit SB[0] is "1" means that setup data (b) and reference data (c) are stored in the first and second latch units 2141 and 2142. Depending on whether the first and second latch units 2141 and 2142 are initialized, S440 or S460 is carried out.

At S440, the controller 2200 determines whether the reference data (c) stored in the second latch unit 2142 is changed according to the first status bit SB[1]. For example, the fact that the logical value of the first status bit SB[1] is "1" means that the reference data (c) is not changed. The fact that the logical value of the first status bit SB[1] is "0" means that the reference data (c) is changed. Depending on whether the reference data (c) is changed, S450 is carried out.

At S450, the controller controls the nonvolatile memory 2100 to perform an initialization operation. The initialization operation performed according to the control of the controller 2200 may be performed when the reference data (c) stored in the second latch unit 2142 is changed while the setup data (b) and the reference data (c) are loaded to the first and second latch units 2142 and 2142.

At S460, a sensing operation is performed. The sensing operation may be performed while the first and second latch units 2141 and 2142 are initialized.

Figure 10:
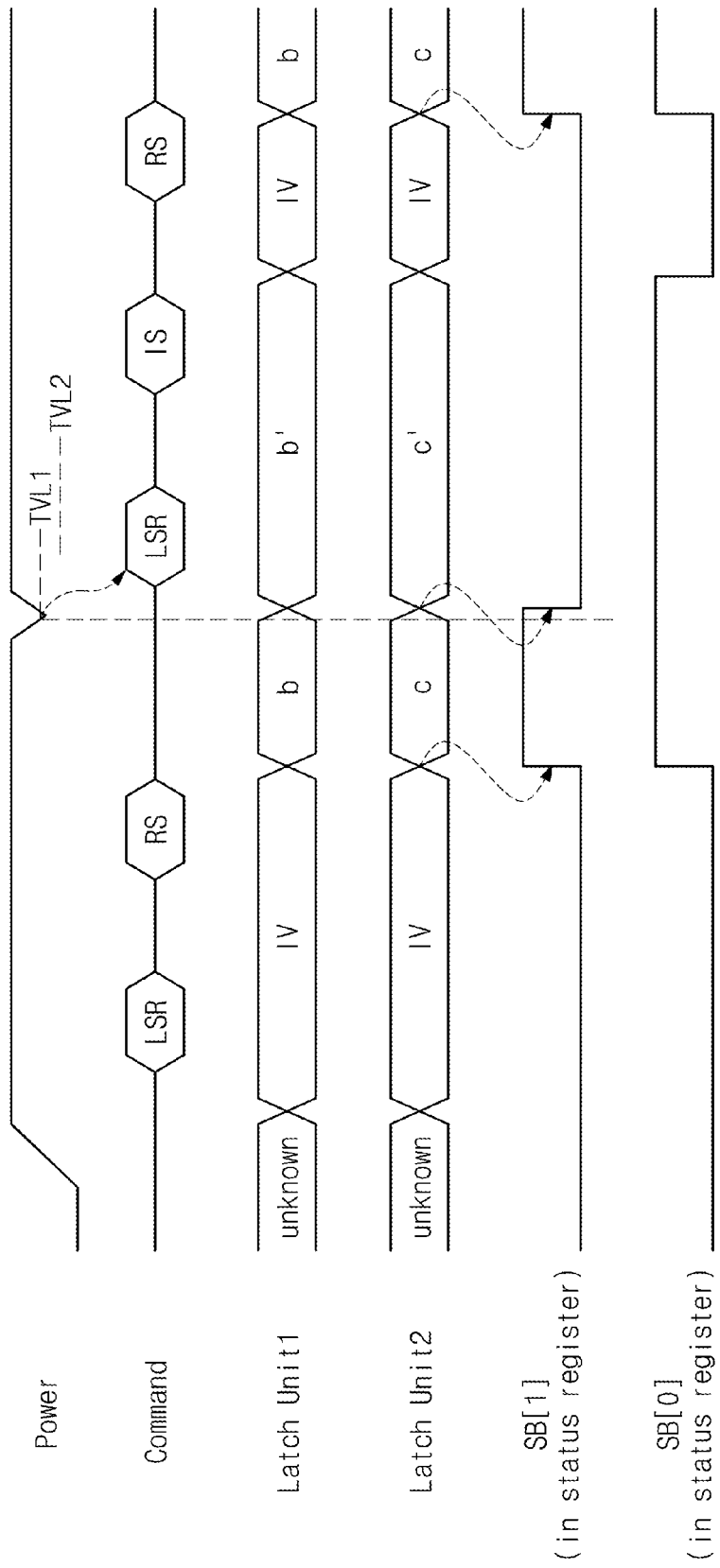
FIG. 10 is a timing diagram illustrating an operation of a memory system when a power voltage level becomes lower than a first critical voltage level in a power-on state.

FIG. 10 is a timing diagram illustrating an operation of a memory system 2000 when a voltage level of a power becomes lower than a first critical voltage level TVL1 in a power-on state.

Referring to FIGS. 8 and 10, the first and second latch units 2141 and 2142 may be initialized on power-up. Each of the first and second latch units 2141 and 2142 may store data IV corresponding to the initialized state.

During the initialization operation, a status register 2180 may also be initialized. Each of the zeroth and first status bits SB[0] and SB[1] may have a logical value of "0". For example, all the latches in the nonvolatile memory 2100 may be initialized.

The controller 2200 transmits a latch status read signal LSR to the nonvolatile memory 2100. In response to the latch status read signal LSR, the nonvolatile memory 2100 may transmit the zeroth and first status bits SB[0] and SB[1]. According to the zeroth status bit SB[0], the controller 2200 may sense that the nonvolatile memory 2100 is in an initialized state. The controller 2200 transmits a reset signal RS to the nonvolatile memory 2100.

The nonvolatile memory 2100 may sense the setup data (b) and the reference data (c) in response to the reset signal RS. The nonvolatile memory 2100 may load the setup data (b) and the reference data (c) to the first and second latch units 2141 and 2142 from a memory cell array 2110.

In the embodiment in FIG. 10, the control logic 2160 causes a logical value of the zeroth status bit SB[0] to transition to "1" when the setup data (b) and the reference data (c) are sensed.

A comparator 152 incorporated in the data detector 2150 may compare an output of a combination logic 151 with the reference data (c). In the embodiment in FIG. 10, when the output of the combination logic 151 is identical to the reference data (c), the logical value of the first status bit SB[1] is "1". Meanwhile, when the output of the combination logic 151 is different from the reference data (c), the logical value of the first status bit SB[1] is "0". Thus, the logical value of the first status bit SB[1] may transition to "1" when the reference data (c) is stored in the second latch unit 2142.

It is assumed that a voltage level of a power is reduced to reach a first critical voltage level, as shown in FIG. 10. The setup data (b) stored in the first latch unit 2141 may be damaged. Data stored in the first latch unit 2141 may be the damaged setup data (b').

Similar to the first latch unit 2141, data stored in the second latch unit 2142 may be damaged. The data stored in the second latch unit may be changed reference data (c').

The data detector 2150 may detect the change of the reference data (c) and change a value of the first status bit SB[1]. The logical value of the first status bit SB[1] may transition to "0".

Exemplarily, the values of the zeroth and first status bits SB[0] and SB[1] may not be changed due to the fact that the voltage level of a power is lower than the first critical voltage level TVL1. A plurality of latches may be included in the status register 2180, and the zeroth and first status bits SB[0] and SB[1] may be stored in the latches. Bits stored in the respective latches of the status register 2180 may not be changed even when the voltage level of a power is lower than a second critical voltage level TVL2. This may be accomplished by adjusting width and length of transistors constituting each latch. However, the bits stored in the respective latches of the status register 2180 may be lost when a power is down (e.g., the voltage level of a power is lower than the second critical voltage level TVL2).

The nonvolatile memory 2100 itself may perform an initialization operation when the power is recovered after the power-down (the voltage level of the power becomes lower than the second critical voltage level TVL2). On the other hand, as illustrated in FIG. 10, the nonvolatile memory 2100 itself may not perform the initialization operation when the voltage level of the power is not reduced to the second critical voltage level TVL2. However, even in this case, the data stored in the first and second latch units 2141 and 2142 may be damaged.

The controller 2200 may sense that the voltage level of the power is lower than the first critical voltage level TVL1 and transmit the latch status read signal LSR. In response to the latch status read signal LSR, the nonvolatile memory 2100 may provide the zeroth and first status bits SB[0] and SB[1] to the controller 2200.

The fact that a logical value of the zeroth status bit SB[0] is "1" means that the first and second latch units 2141 and 2142 are not in an initialized state (or a sensing operation is performed while an initialization operation is not performed). The controller 2200 may sense that data of the second latch unit 2142 is changed according to the first status bit SB[1].

The controller 2200 may transmit an initialization signal IS to the nonvolatile memory 2100. Latches included in the nonvolatile memory 2100 may be initialized in response to the initialization signal IS. The nonvolatile memory 2100 may initialize the first and second latch units 2141 and 2142. The nonvolatile memory 2100 may initialize the status register 2180 storing the zeroth and first status bits SB[0] and SB[1]. Exemplarily, the initialization operation may be performed in the nonvolatile memory 2100 itself or performed in response to the initialization signal IS received from the controller 2200.

After the initialization operation is performed, the controller 2200 may transmit a reset signal RS to the nonvolatile memory 2100. In response to the reset signal RS, the nonvolatile memory 2100 may sense setup data (b) and reference data (c). The setup data (b) is reloaded to the first latch unit 2141, and the reference data (c) is reloaded to the second latch unit 2142.

Figure 11:
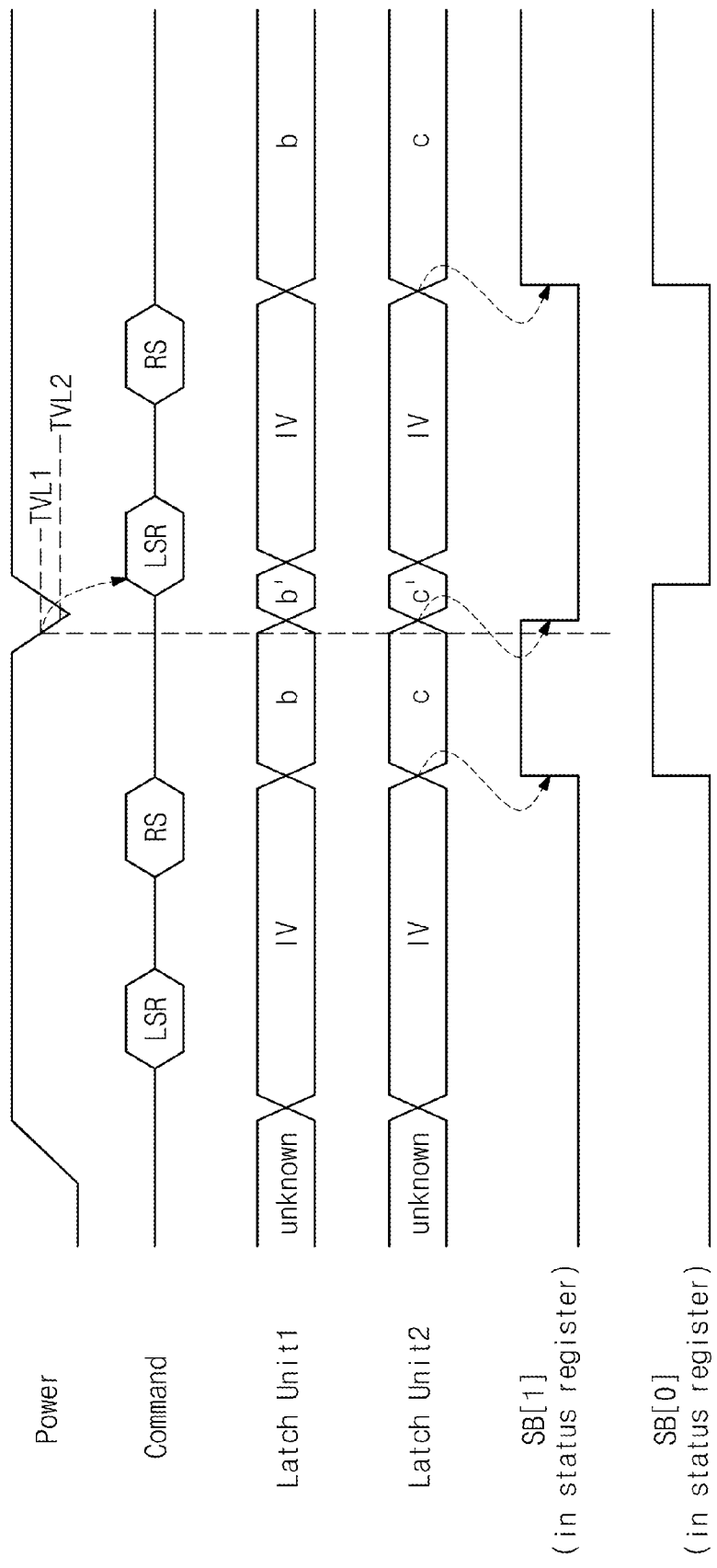
FIG. 11 is a timing diagram illustrating an operation of a memory system when a power voltage level becomes lower than a second critical voltage level in a power-on state.

FIG. 11 is a timing diagram illustrating an operation of the memory system 2000 when a voltage level of a power becomes lower than a second critical voltage level TVL2 in a power-on state. Referring to FIG. 11, the voltage level of a power is reduced to be lower than the second critical voltage level TVL2 while the setup data (b) and the reference data (c) are loaded to the first and second latch units 2141 and 2142, respectively.

When the voltage level of a power becomes lower than the first critical voltage level TVL1, the setup data (b) stored in the first latch unit 2141 may be changed to damaged setup data (b') and the reference data (c) stored in the second latch unit 2142 may be changed to damaged reference data (c').

Afterwards, the voltage level of a power becomes lower than the second critical voltage level TVL2.

When the power is recovered after the voltage level of the power becomes lower than the second critical voltage level (after power-down), the nonvolatile memory 2100 itself may perform an initialization operation without the initialization signal (IS in FIG. 10) from the controller 2200. Specifically, the first voltage level detector 2170 may detect that after power-down, the voltage level of the power reaches the second critical voltage level TVL2. The control logic 2160 may initialize all latches in the nonvolatile memory 2100. The first and second latch units 2141 and 2142 and the status register 2180 may be initialized. Each of the first and second latch units 2141 and 2142 may store data IV in the initialized state. A logical value of each of the first and second status bits SB[0] and SB[1] may be "0".

The controller 2200 may transmit a latch status read signal LSR in response to the fact that the voltage level of the power is lower than the first critical voltage level TVL1. The nonvolatile memory 2100 may provide the zeroth and first status bits SB[0] and SB[1] to the controller 2200 in response to the latch status read signal LSR.

According to the zeroth status SB[0], the controller 2200 may sense that the first and second latch units 2141 and 2142 are in the initialized state. The controller 220 may transmit the reset signal RS to the nonvolatile memory 2100. The nonvolatile memory 2100 may sense the setup data (b) and the reference data (c) in response to the reset signal RS. The setup data (b) may be reloaded to the first latch unit 2141, and the reference data (c) may be reloaded to the second latch unit 2142. A logical value of each of the zeroth and first status bits SB[0] and SB[1] may transition to "1".

Figure 12:
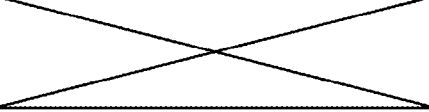
FIG. 12 shows a control signal generated in a controller according to zeroth and first status bits received from a nonvolatile memory.

FIG. 12 shows a control signal generated in the controller 2200 according to the zeroth and first status bits SB[0] and SB[1] received from the nonvolatile memory 2100.

Referring to FIG. 12, when logical values of the zeroth and first status bits SB[0] and SB[1] are each "0", the controller 2200 transmits the reset signal RS because the first and second latch units 2141 and 2142 are in the initialized state.

The fact that the logical value of the zeroth status bit SB[0] is "1" and the logical value of the first status bit SB[1] is "0" means that the reference data (c) is damaged although a sensing operation is performed. The controller 2200 sequentially generates an initialization signal IS and a reset signal RS.

The fact that the logical values of the zeroth and first status bits SB[0] and SB[1] are each "1" means that a sensing operation is performed and the reference data (c) is not damaged. The controller 2200 may determine that the nonvolatile memory 2100 is in a ready state.

Figure 13:
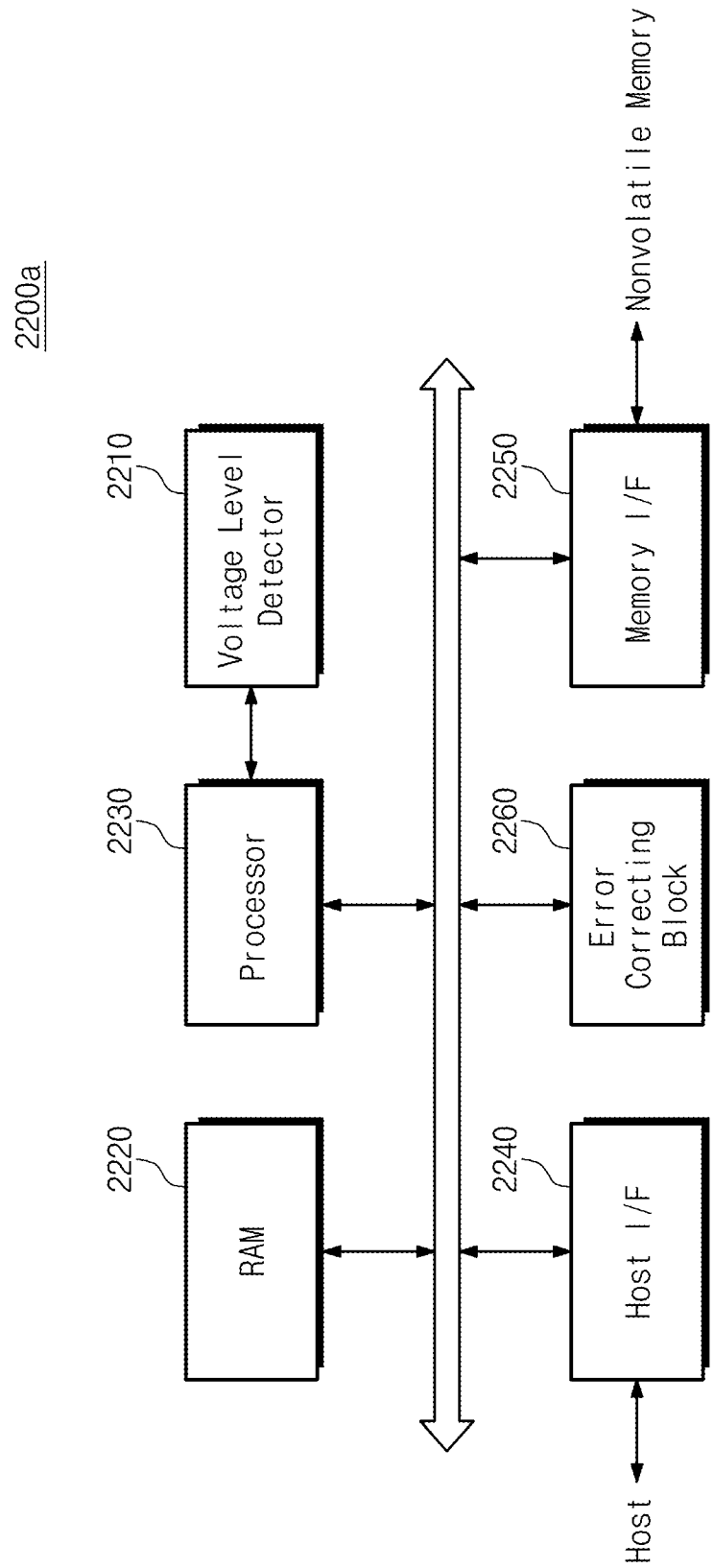
FIG. 13 is a block diagram of one of the controllers shown in FIGS. 1 to 8.

FIG. 13 is a block diagram of any one controller 2200a of the controllers 200 and 2200 shown in FIGS. 1 to 8. Referring to FIG. 13, the controller 2200a includes a voltage level detector 2210, a random access memory (RAM) 2220, a processor 2230, a host interface (Host I/F) 2240, a memory interface (Memory I/F) 2250, and an error correcting block 2260.

The voltage level detector 2210 may be configured to detect a power of the memory system 1000. The RAM 2220 may be used as at least one of a cache memory between the nonvolatile memory 100 and a host and a buffer memory between the nonvolatile memory 100 and the host. The processor 2230 controls the overall operation of the controller 2200a.

The host interface 2240 includes a protocol for data exchange between the host and the controller 2200a. For example, the controller 1200 is configured to communicate with the host through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, and IDE (Integrated Drive Electronics) protocol. The memory interface 2250 interfaces with the nonvolatile memory 100. For example, the memory interface 2250 may include a NAND interface or a NOR interface.

The error correcting block 2260 is configured to detect and correct data read from the nonvolatile memory 100 using an error correcting code (ECC).

Figure 14:
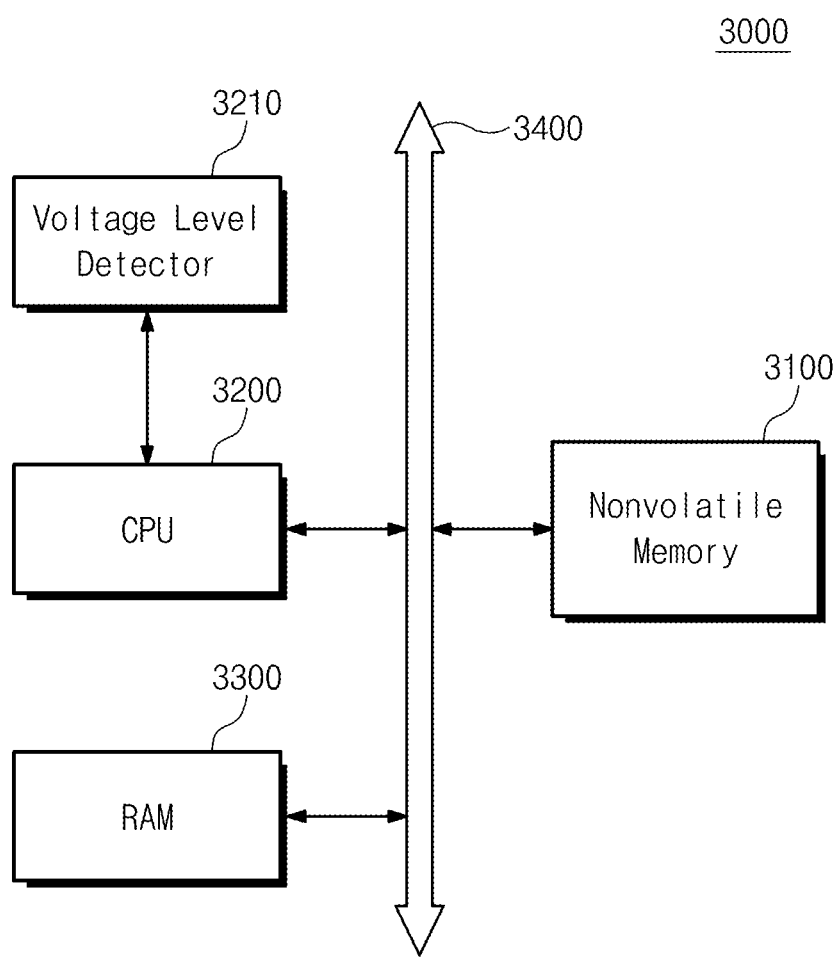
FIG. 14 is a block diagram of a memory system according to further another embodiment of the inventive concept.

FIG. 14 is a block diagram of a memory system 3000 according to further another embodiment of the inventive concept. Referring to FIG. 14, a memory system 3000 includes a nonvolatile memory 3100, a central processing unit (CPU) 3200, a voltage level detector 3210, a RAM 3300, a system bus 3400.

The function of the controller 200 or 2200 described with reference to FIG. 1 or 8 may be performed by the CPU 3200. In this case, the nonvolatile memory 3100 and the CPU 3200 may communicate with each other through the system bus 3400. The RAM 3300 may serve as a working memory of the CPU 3200.

The voltage level detector 3210 may detect a power supplied to the memory system 3000 or the nonvolatile memory 3100. Unlike FIG. 13, the voltage level detector 3210 may be provided as a component of the CPU 3200.

Figure 15:
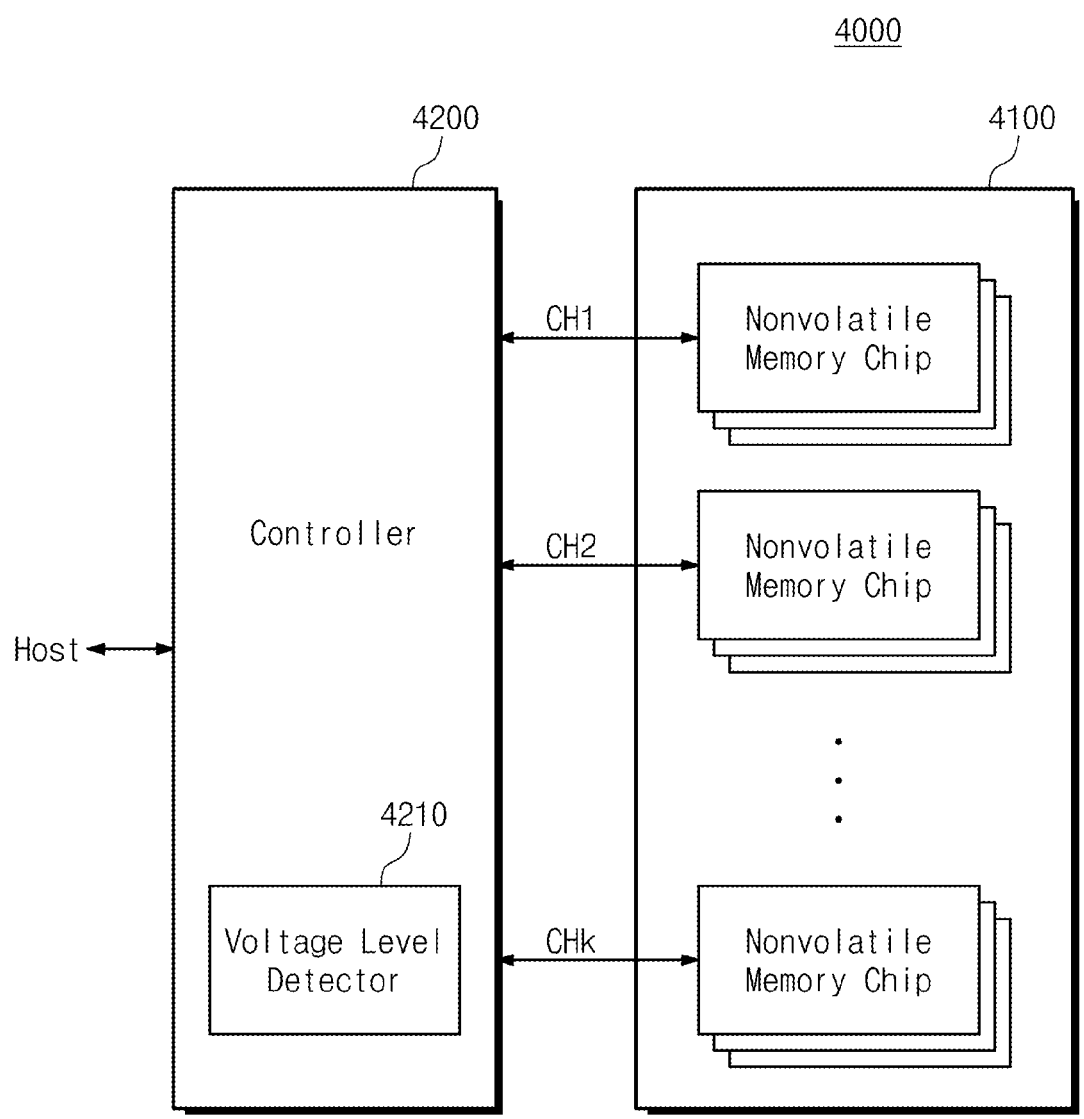
FIG. 15 is a block diagram illustrating an application example of the memory system shown in FIG. 1 or 8.

FIG. 15 is a block diagram illustrating an application example 4000 of the memory system 200 or 2200 shown in FIG. 1 or 8. Referring to FIG. 15, the memory system 4000 includes a nonvolatile memory 4100 and a controller 4200.

The nonvolatile memory 4100 includes a plurality of memory chips. The memory chips are divided into a plurality of groups. Each of the groups is configured to communicate with the controller 4200 through one common channel. Exemplarily, it is shown in FIG. 15 that a plurality of nonvolatile memory chips communicate with the controller 4200 through first to kth channels CH1-CHk. Each of the nonvolatile memory chips may have the same structure and operate the same as the nonvolatile memories 100 and 2100 described with reference to FIG. 8.

The controller 4200 may control a sensing operation for setup data and reference data of each nonvolatile memory chip. When a voltage level of a power supplied to the memory system 4000 decreases, the controller 4200 may perform latch status reading for each nonvolatile memory chip and control the setup data and the reference data of each nonvolatile memory chip.

In FIG. 15, it has been described that a plurality of nonvolatile memory chips are connected to one channel. However, the memory system 4000 may be modified such that one nonvolatile memory chip is connected to one channel.

The nonvolatile memory 4100 and the controller 4200 may be integrated into one semiconductor device. For example, the nonvolatile memory 4100 and the controller 4200 are integrated into one semiconductor device to constitute a memory card such as a personal computer memory card international association (PCMCIA) card, a compact flash card (CF), a smart media card (SM, SMC), a multimedia card (MMC, RS-MMC, MMCmicro), an SD card (SD, miniSD, microSD, SDHC), a universal flash memory device (UFS).

The nonvolatile memory 4100 and the controller 4200 are integrated into one semiconductor device to constitute a solid state drive (SSD). An SSD may include a storage device configured to store data in a semiconductor memory. In the case where the memory system 4000 is used as an SDD, an operating speed of a host connected to the memory system 4000 may be improved dramatically.

Furthermore, the memory system 1000 may be applied to computers, personal computers (PC), ultra mobile personal computers (UM PC), workstations, personal digital assistants (PDAs), portable computers, web tablet PCs, wireless phones, mobile phones, smart phones, e-books, portable multimedia players (PMPs), portable game machines, navigation systems, black boxes, digital cameras, 3-dimensional televisions, digital audio recorders, digital audio players, digital picture recorders, digital picture players, digital video recorders, digital video players, apparatuses capable of receiving and transmitting information under the wireless environment, one of various electronic devices of a home network, one of various electronic devices of a telematics network, radio frequency identification (RFID) devices or one component among various components of a computing system.

Exemplarily, the nonvolatile memory 4100 or the memory system 4000 may be mounted using various types of packages. The nonvolatile memory 4100 or the memory system 4000 may be mounted using packages, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 16:
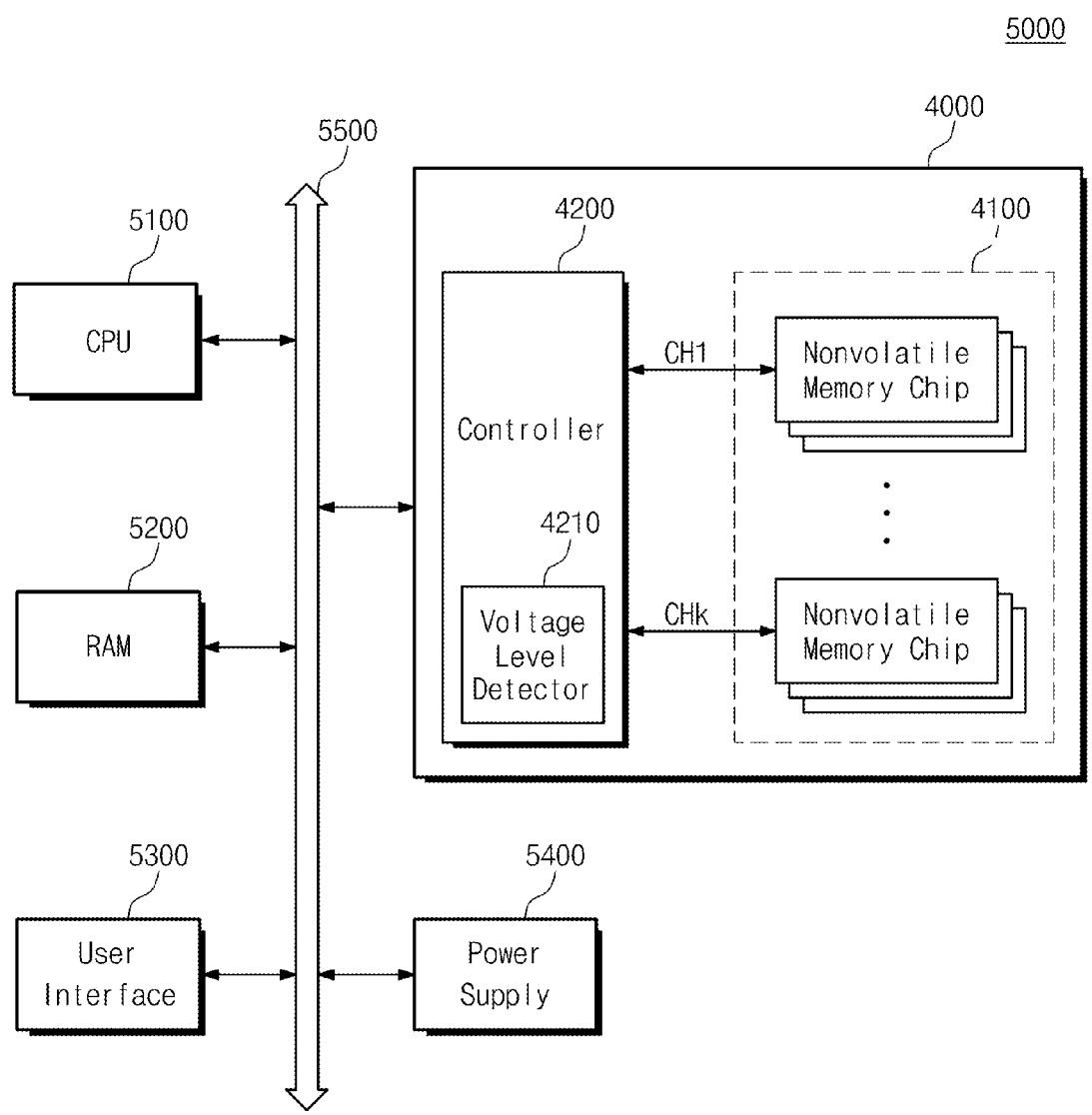
FIG. 16 is a block diagram of a computing system including a memory system shown in FIG. 15.

FIG. 16 is a block diagram of a computing system 5000 including a memory system 4000 shown in FIG. 15. Referring to FIG. 16, the computing system 5000 includes a central processing unit (CPU) 5100, a RAM 5200, a user interface 5300, a power supply 5400, a system bus 5500, and a memory system 4000.

The memory system 4000 is electrically connected to the CPU 5100, the RAM 5200, the user interface 5300, and the power supply 5400 through the system bus 5500. Data provided through the user interface 5300 or processed by the CPU 5100 is stored in the memory system 4000.

In FIG. 16, it is shown that the nonvolatile memory 4100 is connected to the system bus 5500 through the controller 4200. However, the nonvolatile memory 4100 may be configured to be directly connected to the system bus 5500. In this case, the function of the controller 4200 may be performed by the CPU 5100 and the RAM 5200.

In FIG. 16, it is shown that the memory system 4000 described with reference to FIG. 15 is provided. However, the memory system 4000 may be replaced with the memory system 1000 or 2000 described with reference to FIG. 1 or 8.

Exemplarily, the computing system 5000 may be configured to include all the memory systems 1000, 2000, and 5000 described with reference to FIGS. 1, 8, and 15.

According to an embodiment of the inventive concept, sensed setup data is re-sensed depending on whether reference data (c) is changed. Thus, reliability of the setup data (b) stored in a latch unit 141 may be assured although a power is unstable. As a result, reliability of the nonvolatile memory 100 and the memory system 1000 including the same may be improved.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A memory system comprising:
    a nonvolatile memory including a memory cell array storing setup data and reference data, and first and second latch units respectively configured to store the setup data and the reference data sensed from the memory cell array upon a power-up of the memory system; and
    a controller configured to control a sensing operation of the nonvolatile memory,
    wherein an operating environment of the nonvolatile memory is determined by the setup data stored in the first latch unit, and
    wherein the controller controls the nonvolatile memory to re-store the setup data of the memory cell array in the first latch unit when the reference data of the second latch unit is changed.

2. The memory system of claim 1, wherein the nonvolatile memory further includes a data detector configured to detect whether the reference data stored in the second latch unit is changed.

3. The memory system of claim 2, wherein the reference data stored in the memory cell array has a predetermined data pattern, and
    wherein the data detector includes a combination logic configured to output the same data as the predetermined data pattern, and a comparator configured to compare an output of the combination logic with the reference data stored in the second latch unit.

4. The memory system of claim 1, wherein the nonvolatile memory detects whether the reference data stored in the second latch unit is changed and provides information indicative of a result of the detection to the controller.

5. The memory system of claim 4, wherein the controller transmits a reset signal to the nonvolatile memory when the result of the detection indicates the change of the reference data, and
    wherein the nonvolatile memory re-stores the setup data stored in the memory cell array in the first latch unit in response to the reset signal.

6. The memory system of claim 4, wherein the controller generates a latch status read signal when the voltage level of a power supply is lower than a critical voltage level, and
    wherein the nonvolatile memory provides information indicative of the result of the detection to the controller in response to the latch status read signal.

7. The memory system of claim 1, wherein the nonvolatile memory further includes:
    a status register configured to store first and second status bits;

a control logic configured to set up the first status bit depending on whether the sensing operation is performed; and a data detector configured to detect whether the reference data stored in the second latch unit is changed and set up the second status bit according to a result of the detection.

8. The memory system of claim 7, wherein the controller generates a latch status read signal at the power-up or when the voltage level of the power is lower than a critical voltage level, wherein the nonvolatile memory provides the first and second status bits to the controller in response to the latch status read signal, and wherein the controller transmits an initialization signal to the nonvolatile memory according to a value of the first status bit and transmits a reset signal to the nonvolatile memory according to a value of the second status bit.

9. The memory system of claim 8, wherein the nonvolatile memory initializes the first latch unit according to the initialization signal and re-stores the reference data in the first latch unit from the memory cell array according to the reset signal.

10. A memory device comprising:

a nonvolatile memory array configured to store setup data and reference data;

a read circuit connected to the nonvolatile memory array;

a latch circuit connected to the read circuit;

a control logic configured to load the setup data and the reference data into the latch circuit via the read circuit upon a power-up of the memory device;

a data detector configured to detect a corruption of the reference data loaded into the latch circuit, wherein the control logic is further configured to re-load the setup data and the reference data into the latch circuit when the data detector detects the corruption of the reference data.

11. The memory device of claim 10, further comprising a voltage level detector which detects a power supply voltage of the memory device, wherein the control logic is further configured to automatically read an output of the data detector when the voltage level detector indicates that the power supply voltage is less than a given voltage level.

12. The memory device of claim 10, wherein the control logic is further configured to read an output of the data detector in response to a signal received from an external controller.

13. The memory device of claim 10, wherein the data detector comprises:

a combination logic circuit configured to generate a duplicate of the reference data as stored in the memory cell array; and a comparator for comparing the reference data loaded into the latch circuit with the generated duplicate of the reference data.

14. The memory device of claim 10, further comprising a status register including at least one first bit indicative of loading of the set-up data and reference data into the latch circuit, and at least one second bit indicative of whether the data detector has detected the corruption of the reference data loaded into the latch circuit.

15. A control method of a nonvolatile memory including a plurality of memory cells, the control method comprising:

controlling the nonvolatile memory to sense reference data and setup data stored in the memory cells at a power-up of the nonvolatile memory;

determining whether the sensed reference data is changed when a voltage level of a power becomes lower than a critical voltage level; and controlling the nonvolatile memory to re-sense the setup data according to a result of the determination, wherein an operating environment of the nonvolatile memory is determined according to the sensed setup data.

16. The control method of claim 15, wherein the reference data stored in the memory cells has a predetermined data pattern.

17. The control method of claim 15, wherein the sensed reference data and the sensed setup data vary with a change in voltage level of the power.

18. The control method of claim 15, wherein determining whether the sensed reference data is changed comprises:

transmitting a status read control signal to the nonvolatile memory when the voltage level of the power becomes lower than the critical voltage level; and receiving information indicative of whether the sensed reference data is changed, wherein the information indicative of whether the sensed reference data is provided from the nonvolatile memory in response to the status read control signal.

19. The control method of claim 15, wherein the nonvolatile memory performs an initialization operation when the power is recovered after power-down.

20. The control method of claim 19, further comprising:

checking whether the initialization operation is performed when the voltage level of the power becomes lower than the critical voltage level; and controlling the nonvolatile memory to perform the initialization operation according to a result of the checking.

* * * * *